(12) United States Patent
Brost et al.

(10) Patent No.: US 7,650,839 B2
(45) Date of Patent: *Jan. 26, 2010

(54) METHOD FOR REGISTERING PATTERNS ON A WEB

(75) Inventors: Randolph C. Brost, Albuquerque, NM (US); Robert L. Walton, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 570 days.

This patent is subject to a terminal disclaimer.

(21) Appl. No.: 11/500,209

(22) Filed: Aug. 7, 2006

(65) Prior Publication Data

US 2007/0006764 A1   Jan. 11, 2007

Related U.S. Application Data

(63) Continuation-in-part of application No. 11/054,680, filed on Feb. 9, 2005, now Pat. No. 7,100,510.

(51) Int. Cl.
| | |
|---|---|
| *B41F 1/54* | (2006.01) |
| *B41F 1/66* | (2006.01) |
| *B41L 5/12* | (2006.01) |
| *B41L 39/00* | (2006.01) |
| *B41L 47/56* | (2006.01) |
| *B41L 35/14* | (2006.01) |

(52) U.S. Cl. .................... 101/488; 101/484
(58) Field of Classification Search ............... 101/488, 101/484, 32, 181, 248, 483, 486; 347/14, 347/19, 174; 400/74; 156/557; 345/85; 226/42

See application file for complete search history.

(56) References Cited

U.S. PATENT DOCUMENTS

| | | | | |
|---|---|---|---|---|
| 4,428,287 A * | 1/1984 | Greiner | .................. | 101/170 |
| 4,452,140 A * | 6/1984 | Isherwood et al. | .......... | 101/181 |
| 5,056,431 A * | 10/1991 | Sainio | .................. | 101/219 |
| 5,904,961 A | 5/1999 | Tang et al. | | |
| 6,439,684 B1 * | 8/2002 | Yoshimura et al. | ............ | 347/19 |
| 6,579,422 B1 | 6/2003 | Kakinuma | | |
| 6,607,261 B1 * | 8/2003 | Shimada | .................. | 347/19 |
| 6,607,317 B2 * | 8/2003 | Morozumi et al. | ............ | 400/82 |
| 6,621,858 B2 * | 9/2003 | Sourour et al. | .............. | 375/150 |
| 6,633,740 B2 | 10/2003 | Estabrooks | | |
| 6,637,634 B1 | 10/2003 | Yeo et al. | | |
| 6,654,139 B1 * | 11/2003 | Yokoe | .................. | 358/1.15 |
| 6,680,743 B2 | 1/2004 | Kapushinski | | |
| 6,685,297 B2 * | 2/2004 | Butterfield et al. | ............ | 347/19 |
| 6,709,962 B2 | 3/2004 | Berg | | |
| 6,766,843 B2 | 7/2004 | Hilt et al. | | |

(Continued)

*Primary Examiner*—Judy Nguyen
*Assistant Examiner*—Leo T Hinze

(57) ABSTRACT

A method for registering patterns on a web to provide independent scale control in both the lateral and longitudinal directions is provided. The method includes routing the web over a first roller; routing the web over a second roller and stabilizing the web; applying a pattern to the web using process hardware; measuring registration of the pattern and providing an error signal; controlling lateral position error using the error signal; controlling longitudinal position error using the error signal; controlling lateral scale error using the error signal; and controlling longitudinal scale error using the error signal. The method provides independent scale control in both the lateral and longitudinal directions. Independent scale control avoids non-linear distortions otherwise imposed by attempting to accomplish both corrections by stretching the web in both directions.

20 Claims, 2 Drawing Sheets

U.S. PATENT DOCUMENTS

| | | |
|---|---|---|
| 6,771,237 B1 | 8/2004 | Kalt |
| 6,908,175 B2 * | 6/2005 | Kikuta et al. ................ 347/41 |
| 7,100,510 B2 * | 9/2006 | Brost et al. ................ 101/488 |
| 2003/0020930 A1 * | 1/2003 | Yagi ........................ 358/1.8 |
| 2005/0219300 A1 * | 10/2005 | Fujita ........................ 347/16 |
| 2005/0276646 A1 * | 12/2005 | Morimoto et al. ............ 400/62 |

* cited by examiner

METHOD FOR REGISTERING PATTERNS ON A WEB

This application is a continuation-in-part of 11/054,680 filed on Feb. 9, 2005 U.S. Pat. No. 7,100,510, issued Sep. 05, 2006, the disclosure of which is hereby incorporated by reference herein in its entirety.

FIELD OF THE INVENTION

The invention relates to a method for registering multiple patterns on a web of material, and more particularly, a web of polyethylene terephthalate (PET) which exhibits poor dimensional stability relative to requirements, for display manufacture for example.

BACKGROUND OF THE INVENTION

Several manufacturing processes require application of a pattern or patterns to web materials. Examples include printing, and the manufacture of electronic assemblies on flexible substrates. When multiple patterns are applied in sequence, proper alignment or registration must be achieved between patterns. Registration errors can cause misalignment between process steps or layers, as shown in FIGS. 1 and 2. In these figures, the "+" and "●" symbols represent patterns applied in different process steps. FIG. 1 shows correct registration, where all "+" and "●" symbols are aligned. FIG. 2 shows registration error resulting from positional misalignment between the two process steps.

Registration precision is limited by manufacturing process hardware, and also by the dimensional stability of the web substrate. When the web material is dimensionally unstable, then no amount of precise position control will lead to correct registration. This is shown in FIG. 3 where the web has undergone a dimensional change between process steps. As a result, most points are not correctly aligned, even though points on the left side near the web centerline are correctly positioned.

Commonly used web materials such as polyethylene terephthalate (PET) exhibit poor dimensional stability relative to requirements, for display manufacture for example. They have a high coefficient of thermal expansion, experience hygroscopic expansion in humid environments, and can exhibit anisotropic shrink when exposed to moderately high temperatures. These material properties prevent high-precision registration using position-controlled web conveyance systems, leading instead to results such as those shown in FIG. 3. Nonetheless, PET is desirable for some final products because of its transparency, light weight, flexibility, durability, and toughness. A method of precisely registering multiple patterns on a web with limited dimensional stability is needed.

SUMMARY OF THE INVENTION

Briefly summarized, according to one aspect of the invention, a method for registering patterns on a web comprises the steps of: routing the web over a first roller; routing the web over a second roller and stabilizing the web; applying a pattern to the web using process hardware; measuring registration of the pattern and providing an error signal; controlling lateral position error using the error signal; controlling longitudinal position error using the error signal; controlling lateral scale error using the error signal; and controlling longitudinal scale error using the error signal.

The method of the present invention provides independent scale control in both the lateral and longitudinal web directions. Independent scale control avoids non-linear distortions that might be imposed by attempting to accomplish both corrections by stretching the web in both directions. The method of precisely registering multiple patterns on a web allows webs with limited dimensional stability, such as PET, to be used.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

Figure 1:
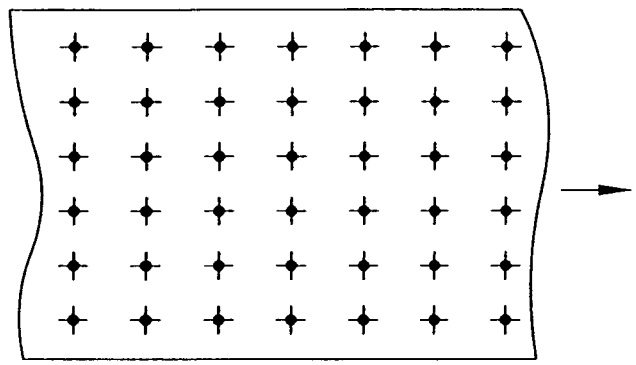
FIG. 1 illustrates prior art multiple patterns on a web with correct registration.
Figure 2:
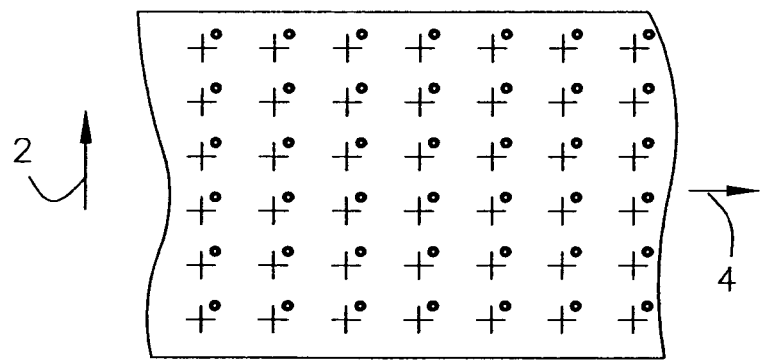
FIG. 2 illustrates prior art multiple patterns on a web with incorrect registration wherein the "+" and "●" patterns are not aligned atop one another.
Figure 3:
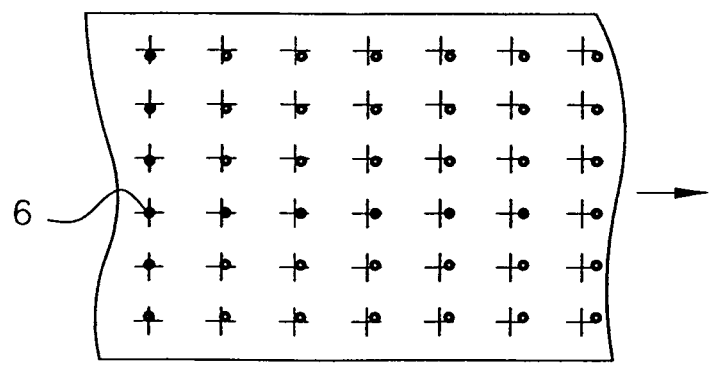
FIG. 3 illustrates prior art multiple patterns on a dimensionally unstable web with incorrect registration wherein some of the "+" and "●" patterns are not aligned atop one another.

Referring to FIGS. 1-3, first, specific types of registration errors will be defined. Registration errors may correspond to an error in position, scale, or both in combination. FIG. 1 shows an example of a pattern with no errors. Each "●" symbol is perfectly superimposed over its corresponding "+" symbol. In FIG. 2, every "●" symbol is shifted a uniform distance away from its corresponding "+" symbol. FIG. 2 thus shows a pure position error; the array of "●" symbols may be brought into correct registration by a pure translation. As indicated by arrows 2 and 4, FIG. 2 shows a position error in both the lateral direction 2 and longitudinal direction 4. In FIG. 3, there is a pure scale error. The "●" symbol or dot 6 at the left side is aligned correctly; all others are off by an error distance that increases with distance from dot 6. This error may be corrected by scaling the array of "●" symbols. In this example, the scale error is anisotropic, meaning that the magnitude of the scale error is different in the lateral and longitudinal directions.

Figure 4:
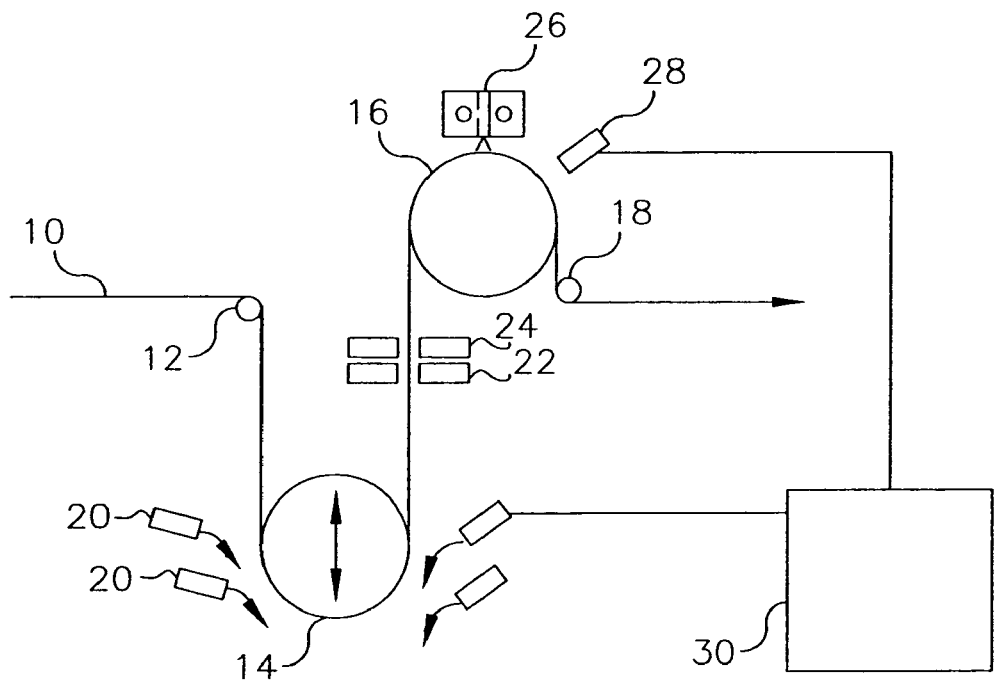
FIG. 4 is a diagram illustrating the web conveyance path with apparatus for controlling position and scale wherein patterning is applied using a printing process.

Referring to FIG. 4, a web 10 passes first over an entrance idler roller 12, then a compensating roller 14, a stabilizing roller 16 and finally an exit idler roller 18. Compensating roller 14 moves, as indicated by the arrow, toward and from stabilizing roller 16 to adjust web tension.

Compensating roller 14 and stabilizing roller 16 may be temperature controlled, either by passing through a temperature-controlled fluid or by some other means well known to those skilled in the art. Optionally a number of airjets 20 may be directed toward web 10 as it passes over roller 14 to assist with temperature control. Additional temperature control may optionally be provided with a heater, such as radiant heater 22, positioned to heat the web or portions thereof as needed. Optionally a thermographic sensor 24 may be positioned downstream of radiant heater 22 to sense web temperature and provide a signal to enable heater 22.

Roller 16 stabilizes the web while the patterning process is applied by process hardware 26. The process hardware 26 may be an ink jet print head, or some other patterning device. Other patterning devices may include offset lithographic devices, gravure coaters, flexographic printing devices, screen printing devices, and radiant energy beam patterning devices such as electron beam patterning devices or laser patterning device. Laser patterning devices may include those that pattern by mass transfer to the substrate, ablation of material on the substrate, adhesion transfer or changing the surface to allow preferential material growth. Laser patterning equipment and methods for changing the surface to allow preferential material growth include those described in *J. Vac. Sci. Technol. A* 3(3), 904 (1985) and *Appl. Phys. Lett.* 45(6), 617 (1984).

Process hardware 26 includes some means of actively adjusting the length of the pattern it creates in the lateral direction. This may be accomplished by applying tension to the process hardware to vary its length, or by adjusting the temperature of the process hardware so its length changes due to thermal expansion. If the latter is chosen, fluid passages may be included in process hardware 26 to allow passage of a temperature-controlled fluid. For radiant energy beam patterning devices such as electron beam patterning devices and laser patterning devices, pattern adjustments may be conveniently performed by controlling positioning of an applied radiant energy beam as it is scanned across the substrate.

One or more cameras 28 are provided to measure current registration to provide an error signal that is fed back to a controller 30. Typically two cameras are provided, one at either edge of the web, but additional cameras could be included either downstream or in other locations. The cameras measure position and scale error in both the lateral and longitudinal directions. The cameras are an example of a sensor for measuring current registration accuracy; other sensors with different operating modalities could be provided instead of, or in addition to the cameras. Other sensors, such as encoders and load cells, would naturally also be included in the system, but are not shown in the drawings.

The errors measured by the cameras 28 are communicated to the controller 30, which determines corrections required for lateral position error, longitudinal position error, lateral scale error, and longitudinal scale error. These four errors are then corrected using independent adjustment methods.

Lateral position error may be controlled by translating the process hardware 26 back and forth in the lateral direction, while holding the stabilizing roller 16 in a fixed position laterally. An alternative method of controlling lateral position error is to steer the web using a web guider, well known to those skilled in the art.

Longitudinal position error may be controlled by synchronizing the stabilizing roller 16 with process execution. For example, if the process hardware 26 is an ink jet print head, then the timing of ink ejection is coordinated with the web position as determined by the system sensors. An alternative method for controlling longitudinal position error is to adjust web tension so the web "walks" to a new position on the stabilizing roller 16. This latter method requires slow correction of errors.

Lateral scale error may be controlled by adjusting the length of the process hardware. As described above, this is accomplished by either mechanical adjusting such as by stretching, or temperature modulation which causes thermal expansion.

Longitudinal scale error may be controlled by varying the temperature of the compensating roller 14 and stabilizing roller 16 to effectively change the temperature of the web 10. This results in thermal expansion of the web, changing both longitudinal and lateral scale. Since the goal is to change only longitudinal scale, the change in lateral scale must be corrected by the controller 30 and lateral scale control system. A second method of controlling longitudinal scale error is to use the compensating roller 14 to adjust web tension. This slightly stretches the web, adjusting scale in the longitudinal direction. Stretching the web in the longitudinal direction also reduces the width of the web in the lateral direction, due to Poisson's ratio. This effect must be anticipated by the controller 30 and corrected by the lateral scale control system. Alternatively temperature modulation and stretching could be used together to provide lateral and longitudinal control, which would not require dimensional change of the process hardware 26.

The present invention provides independent scale control in both the lateral and longitudinal directions. Independent scale control avoids non-linear distortions that might be imposed by systems that attempt to accomplish both corrections by stretching the web in both directions. Where process hardware 26 comprises a radiant energy beam patterning device, each of the lateral position error, longitudinal position error, lateral scale error, and longitudinal scale error may be controlled by controlling positioning of an applied radiant energy beam as it is scanned across the substrate, and in a particular embodiment of the invention at least one of such errors are controlled in such manner.

Also note that scale changes of both increasing and decreasing magnitude will be required to remove all expected dimensional errors, so the system must be operated at an intermediate nominal tension that will allow tension to be reduced without lowering tension below minimum acceptable levels. For similar reasons, the nominal scale of the process hardware controlling scale in the lateral direction must be chosen to be near the middle of an acceptable range of achievable scale factors.

During operation, web 10 traverses a path over roller 16 where a pattern is applied by print head 26. Camera system 28 checks the pattern applied and develops an error signal that is input to controller 30. The controller uses information from the error signal to initiate corrections to yield correct registration.

In the preferred embodiment, the controller 30 can adjust the lateral position of the process hardware 26 to control lateral position error, adjust the process application timing of the process hardware 26 to control longitudinal position error, adjust the temperature of the process hardware 26 to change its length and thereby adjust lateral scale error, and adjust the position of the compensating roller 14 to vary web tension and thereby control longitudinal scale error.

In an alternative embodiment, the controller 30 can use a web guider (not shown) to steer the web to control lateral position error, adjust the compensating roller to cause the web to "walk" to control longitudinal position error, adjust stretching devices (not shown) to adjust the process hardware 26 and control lateral scale error, and adjust the temperature of the rollers 14 and 16, optional air jets 20, and radiant heaters 22 to vary web temperature and thereby control longitudinal scale error. In yet a third embodiment, the controller 30 can adjust the lateral position of the process hardware 26 to control lateral position error, adjust the process application timing of the process hardware 26 to control longitudinal position error, adjust the temperature of the rollers 14 and 16, optional air jets 20, and radiant heaters 22 to vary web temperature and thereby adjust lateral scale error, and adjust the position of the compensating roller 14 to vary web tension and thereby control longitudinal scale error.

As can be appreciated by one with ordinary skill in the art, aspects of these embodiments could be used in other combinations to control the four types of errors.

Figure 5:
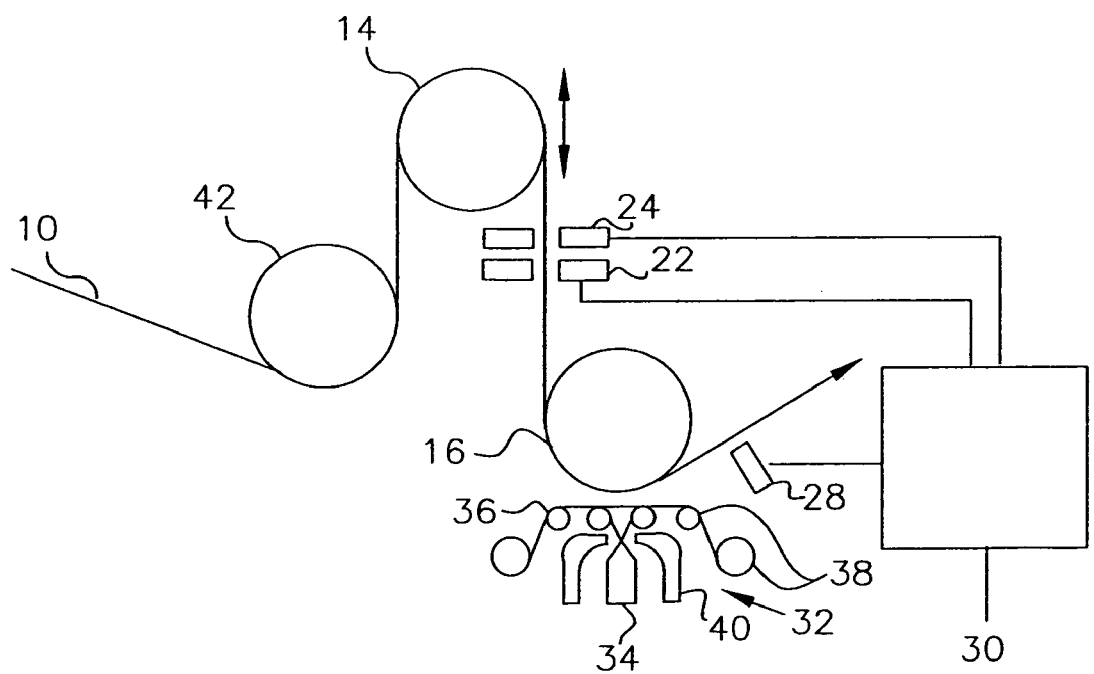
FIG. 5 is a diagram illustrating the web conveyance path with apparatus for controlling position and scale wherein patterning is applied using a deposition process.

FIG. 5 shows an alternative embodiment where the process hardware 32 applies its process in an upward direction. The pattern is achieved by deposition from a deposition source 34 ejecting material through a shadow mask 36. The deposition source may use any of a number of processes which can apply material onto a substrate through a shadow mask to form a thin film. Examples include evaporative deposition, sputtering, plasma-enhanced chemical vapor deposition, and the like. The shadow mask 36 has apertures allowing the material to pass through selected locations. The shadow mask 36 is held by mask rollers 38 which allow a long ribbon shadow mask to be automatically advanced to a new set of apertures. However, a fixed shadow mask 36 is also possible, in which case the "rollers" 38 are fixed mounting points. In either case, lateral scale control is accomplished by adjusting the temperature of the mask rollers 38, which thermally expand to change their length. The mask rollers 38 also conduct heat to the shadow mask 36, thereby adjusting its temperature and causing thermal expansion of the mask. Thermal expansion of the mask causes the pattern of mask apertures to change their length, providing lateral scale control of the resulting deposited pattern. Temperature control of the mask rollers 38 may be achieved by fluid flow through passageways in the rollers, for example. Additional active thermal shielding 40 is shown to reduce the thermal load from the deposition source to the mask.

Control of the remaining error types is accomplished using similar means to those described for FIG. 4. For example, longitudinal position control may be accomplished by synchronizing the action of the deposition source 34 with the position of the web in the longitudinal direction. The action of the deposition source may be controlled by a number of methods well known to those skilled in the art, such as using a shutter (not shown). An additional temperature controller 42 helps route the web. The apparatus of FIG. 5 is suited to OLED manufacture.

The invention has been described with reference to the preferred embodiments. It will be appreciated that variations and modifications can be effected by a person of ordinary skill in the art without departing from the scope of the invention. The fundamental idea is to use different adjustments to achieve scale control in the longitudinal and lateral directions. For example, web tension adjustment could be used to provide longitudinal scale control, while temperature modulation of the process hardware could be used to provide lateral scale control. Decoupling scale control of the two directions has the advantage of avoiding the non-linear web distortions that may result from attempting to stretch the web in both directions.

The invention has been described in detail with particular reference to certain preferred embodiments thereof, but it will be understood that variations and modifications can be made without departing from the invention. It is accordingly intended that the claims shall cover all such modifications and applications as they do not depart from the true spirit and scope of the invention.

PARTS LIST 2 lateral direction
4 longitudinal direction
6 symbol/dot
10 web
12 entrance idler roller
14 compensating roller
16 web stabilizing roller
18 exit idler roller
20 air jets
22 radiant heater
24 thermographic sensor
26 process hardware/printhead
28 camera
30 controller
32 process hardware
34 deposition source
36 shadow mask
38 mask rollers
40 active thermal shielding
42 temperature controlled roller

The invention claimed is:

1. A method for registering patterns on a web, comprising the steps of:
   routing the web over a first roller;
   routing the web over a second roller and stabilizing the web;
   applying a pattern to the web using process hardware;
   measuring registration of the pattern and providing an error signal;
   controlling lateral position error using the error signal;
   controlling longitudinal position error using the error signal;
   controlling lateral scale error using the error signal; and
   controlling longitudinal scale error using the error signal;
   wherein the process hardware comprises an offset lithographic device, gravure coater, flexographic printing device, screen printing device, or radiant energy beam patterning device.

2. The method of claim 1 including the step of controlling the lateral position error by controlling web position with a web guider.

3. The method of claim 1 including the step of controlling the lateral position error by moving the process hardware laterally.

4. The method of claim 1 including the step of controlling the longitudinal position error by synchronizing the action of the process hardware with the longitudinal motion of the web.

5. The method of claim 1 including the step of controlling the temperature of the process hardware to control lateral scale error.

6. The method of claim 1 including the step of adjusting the process hardware to control lateral scale error.

7. The method of claim 1 including the step of controlling the temperature of the first and second rollers.

8. The method of claim 1 including the step of controlling the temperature of the first and second rollers to control longitudinal scale error.

9. The method of claim 8 including the step of controlling the position of the first roller to control web tension and longitudinal position error.

10. The method of claim 1 including the step of controlling the temperature of the first and second rollers to control lateral scale error.

11. The method of claim 10 including the step of controlling the position of the first roller to control web tension and longitudinal position error.

12. The method of claim 1 where the process hardware comprises a radiant energy beam patterning device.

13. The method of claim 12 where the radiant energy beam patterning device comprises an electron beam patterning device.

14. The method of claim 12 where the radiant energy beam patterning device comprises a laser patterning device.

15. The method of claim 14 where the laser patterning device patterns by mass transfer to the substrate, ablation of material on the substrate, adhesion transfer, or changing the substrate surface to allow preferential material growth.

16. The method of claim 12 where at least one of the lateral position error, longitudinal position error, lateral scale error, or longitudinal scale error controlled by controlling positioning of an applied radiant energy beam as it is scanned across the substrate.

17. The method of claim 1 where the process hardware comprises an offset lithographic device.

18. The method of claim 1 where the process hardware comprises a gravure coater.

19. The method of claim 1 where the process hardware comprises a flexographic printing device.

20. The method of claim 1 where the process hardware comprises a screen printing device.

* * * * *